United States Patent
Maguire et al.

(10) Patent No.: US 10,516,929 B2
(45) Date of Patent: Dec. 24, 2019

(54) AUDIO DEVICE

(71) Applicant: Bose Corporation, Framingham, MA (US)

(72) Inventors: Stephen J. Maguire, Grafton, MA (US); Michael Andrew Zalisk, Grafton, MA (US); Jordan Jeffery Bonner, Waltham, MA (US); Ricardo F. Carreras, Southborough, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/150,738

(22) Filed: Oct. 3, 2018

(65) Prior Publication Data
US 2019/0281376 A1 Sep. 12, 2019

Related U.S. Application Data

(63) Continuation-in-part of application No. 15/913,143, filed on Mar. 6, 2018, now Pat. No. 10,212,507.

(51) Int. Cl.
*H04R 1/10* (2006.01)

(52) U.S. Cl.
CPC ......... *H04R 1/1016* (2013.01); *H04R 1/1041* (2013.01); *H04R 1/1058* (2013.01)

(58) Field of Classification Search
CPC ... H04R 1/1016; H04R 1/1041; H04R 1/1058
See application file for complete search history.

(56) References Cited

U.S. PATENT DOCUMENTS

| | | | |
|---|---|---|---|
| 5,126,669 A | 6/1992 | Honess et al. | |
| 5,991,085 A * | 11/1999 | Rallison | G02B 27/017 345/8 |
| 9,141,194 B1 * | 9/2015 | Keyes | G06F 3/017 |
| 9,854,345 B2 | 12/2017 | Briggs | |
| 10,212,507 B1 | 2/2019 | Maguire et al. | |
| 2006/0034478 A1 | 2/2006 | Davenport | |

(Continued)

FOREIGN PATENT DOCUMENTS

| | | |
|---|---|---|
| EP | 2645750 A1 | 10/2013 |
| WO | 2013155217 A1 | 10/2013 |

OTHER PUBLICATIONS

The International Search Report and the Written Opinion of the International Searching Authority dated Jul. 4, 2019 for PCT Application No. PCT/US2019/020914.

(Continued)

*Primary Examiner* — Simon King
(74) *Attorney, Agent, or Firm* — Brian M. Dingman; Dingman IP Law, PC

(57) ABSTRACT

A headphone includes an electro-acoustic transducer for creating audio output, the electro-acoustic transducer comprising a transducer magnet that produces a transducer magnetic field having a magnetic field strength, structure that is constructed and arranged to be positioned so as to direct the audio output at the ear canal of the ear of a wearer of the headphone, a magnetic field sensor constructed and arranged to sense the Earth's magnetic field, and a nulling magnet constructed and arranged to produce a nulling magnetic field that reduces the strength of the transducer magnetic field at the magnetic field sensor.

19 Claims, 7 Drawing Sheets

(56) References Cited

U.S. PATENT DOCUMENTS

| | | |
|---|---|---|
| 2007/0092093 A1 | 4/2007 | Shim |
| 2013/0272563 A1 | 10/2013 | Boyd |
| 2015/0181355 A1 | 6/2015 | Pedersen |
| 2017/0014071 A1 | 1/2017 | Readdie et al. |
| 2017/0090003 A1 | 3/2017 | Guo |
| 2017/0093079 A1* | 3/2017 | Wagman ............... A45C 13/02 |
| 2017/0160086 A1* | 6/2017 | Kesaniemi ............ G01C 17/28 |
| 2017/0208382 A1 | 7/2017 | Grinker |
| 2018/0088185 A1* | 3/2018 | Woods ............... G01R 33/0035 |
| 2018/0096770 A1 | 4/2018 | Danielson et al. |
| 2018/0193728 A1* | 7/2018 | Bashkirov ............... A63F 13/21 |

OTHER PUBLICATIONS

U.S. Appl. No. 62/626,967, filed Feb. 6, 2018.

* cited by examiner

AUDIO DEVICE

CROSS-REFERENCE TO RELATED APPLICATION

This application is a continuation in part of application Ser. No. 15/913,143, filed on Mar. 6, 2018, the entire disclosure of which is incorporated herein by reference.

BACKGROUND

This disclosure relates to audio devices such as all types of headphones, including but not limited to audio-enabled eyeglass headphones.

Audio devices such as audio-enabled eyeglass headphones and earphones (e.g., earbuds or headphones) can include orientation tracking systems that use a magnetometer to track motions of the head and the direction in which the wearer is looking. Magnetometers need to accurately detect the Earth's magnetic field. The audio device's electro-acoustic transducer typically includes a magnet. Since many of these audio devices, such as in-ear headphones (sometimes also called earbuds) and eyeglasses with audio capability built into a temple piece (i.e., eyeglass headphones) are desirably quite small, of necessity the magnetometer is close to the magnet of the transducer. The magnetic field of the transducer magnet typically has a magnetic field strength that is much greater than the Earth's magnetic field. Accordingly, the transducer's magnetic field can overwhelm the magnetometer and prevent it from working properly.

SUMMARY

All examples and features mentioned below can be combined in any technically possible way.

In one aspect, a headphone includes an electro-acoustic transducer for creating audio output, the electro-acoustic transducer comprising a transducer magnet that produces a transducer magnetic field having a magnetic field strength, a housing constructed and arranged to be positioned at an ear of a wearer so as to direct the audio output at the ear canal of the ear, a magnetic field sensor positioned in the housing and constructed and arranged to sense the Earth's magnetic field, and a nulling magnet positioned in the housing and constructed and arranged to produce a nulling magnetic field that reduces the strength of the transducer magnetic field at the magnetic field sensor.

Embodiments may include one of the following features, or any combination thereof. The magnetic field sensor may comprise a three-axis magnetometer. The nulling magnet may comprise a permanent magnet. The nulling magnet may comprise an electromagnet.

Embodiments may include one of the above and/or below features, or any combination thereof. The electro-acoustic transducer may comprise a magnetic structure that comprises the transducer magnet and magnetic material that guides the transducer magnetic field. The magnetic structure may span a magnetic structure distance, and the magnetic field sensor may be located within a distance from the magnetic structure that is no greater than the magnetic structure distance. The headphone may further comprise an additional magnet that is spaced from the magnetic structure by an inter-magnet distance. The magnetic field sensor may be located within a distance from both the magnetic structure and the additional magnet that is no greater than the inter-magnet distance. The headphone may comprise an earbud and the housing may comprise an earbud body, and the magnetic structure and the additional magnet may both be located within the earbud body. The additional magnet may comprise a coupling magnet for coupling the earbud to another structure.

Embodiments may include one of the above and/or below features, or any combination thereof. The headphone may comprise an earbud, and the housing may comprise an earbud body. The magnetic field sensor may have a sensed magnetic field range where it operates linearly, and the nulling magnetic field may reduce the strength of the transducer magnetic field at the magnetic field sensor such that the sensed magnetic field strength is in the sensed magnetic field range where the magnetic field sensor operates linearly. The transducer magnetic field strength at the position of the magnetic field sensor may be at least 1000'. The magnetic field sensor may be positioned less than 10 mm from the electro-acoustic transducer. The transducer magnet may have a diameter of about 8 mm.

In another aspect, an earbud includes an electro-acoustic transducer for creating audio output, the electro-acoustic transducer comprising a transducer magnet that produces a transducer magnetic field having a magnetic field strength, an earbud body constructed and arranged to be positioned at an ear of a wearer so as to direct the audio output at the ear canal of the ear, a three-axis magnetometer positioned in the earbud body and constructed and arranged to sense the Earth's magnetic field, and a nulling permanent magnet positioned in the earbud body and constructed and arranged to produce a nulling magnetic field that reduces the strength of the transducer magnetic field at the three-axis magnetometer. The three-axis magnetometer has a sensed magnetic field range where it operates linearly, and the nulling magnetic field reduces the strength of the transducer magnetic field at the three-axis magnetometer such that the sensed magnetic field strength is in the sensed magnetic field range where the three-axis magnetometer operates linearly.

Embodiments may include one of the above and/or below features, or any combination thereof. The electro-acoustic transducer may comprise a magnetic structure that comprises the transducer magnet and magnetic material that guides the transducer magnetic field, wherein the magnetic structure spans a magnetic structure distance, and wherein the three-axis magnetometer is located within a distance from the magnetic structure that is no greater than the magnetic structure distance. The transducer magnet may have a diameter of about 8 mm and the three-axis magnetometer may be positioned less than 10 mm from the electro-acoustic transducer. The transducer magnetic field strength at the position of the three-axis magnetometer may be at least 100 µT. The earbud may further comprise a coupling magnet positioned within the earbud body and adapted to couple the earbud to another structure, wherein the coupling magnet is spaced from the magnetic structure by an inter-magnet distance, and wherein the magnetic field sensor is located within a distance from both the magnetic structure and the coupling magnet that is no greater than the inter-magnet distance.

In another aspect, an audio device includes an electro-acoustic transducer for creating audio output, the electro-acoustic transducer comprising a transducer magnet that produces a transducer magnetic field having a magnetic field strength, structure that is constructed and arranged to be positioned so as to direct the audio output towards an ear of a wearer, a magnetic field sensor constructed and arranged to sense the Earth's magnetic field, and a nulling magnet constructed and arranged to produce a nulling magnetic field that reduces the strength of the transducer magnetic field at the magnetic field sensor.

Embodiments may include one of the above and/or below features, or any combination thereof. The magnetic field sensor may comprise a three-axis magnetometer. The nulling magnet may comprise a permanent magnet. The nulling magnet may comprise an electromagnet. The electro-acoustic transducer may comprise a magnetic structure that comprises the transducer magnet and magnetic material that guides the transducer magnetic field. The magnetic structure may span a magnetic structure distance, and the magnetic field sensor may be located within a distance from the magnetic structure that is no greater than the magnetic structure distance. The audio device may further comprise an additional magnet that is spaced from the magnetic structure by an inter-magnet distance. The magnetic field sensor may be located within a distance from both the magnetic structure and the additional magnet that is no greater than the inter-magnet distance.

Embodiments may include one of the above and/or below features, or any combination thereof. The magnetic field sensor may have a sensed magnetic field range where it operates linearly, and the nulling magnetic field may reduce the strength of the transducer magnetic field at the magnetic field sensor such that the sensed magnetic field strength is in the sensed magnetic field range where the magnetic field sensor operates linearly. The transducer magnetic field strength at the position of the magnetic field sensor may be at least 100 µT. The magnetic field sensor may be positioned less than 10 mm from the electro-acoustic transducer. The transducer magnet may have a diameter of about 8 mm. The structure may comprise an eyeglass temple piece, and the transducer, the magnetic field sensor, and the nulling magnet may all be carried by the eyeglass temple piece. The audio device may further comprise a housing carried by the eyeglass temple piece. The transducer, the magnetic field sensor, and the nulling magnet may all be positioned in the housing.

In another aspect, an eyeglass headphone includes an electro-acoustic transducer for creating audio output, the electro-acoustic transducer comprising a transducer magnet that produces a transducer magnetic field having a magnetic field strength, a temple piece constructed and arranged to be positioned proximate an ear of a wearer and to direct the audio output towards the ear, a three-axis magnetometer carried by the temple piece and constructed and arranged to sense the Earth's magnetic field, and a nulling magnet carried by the temple piece and constructed and arranged to produce a nulling magnetic field that reduces the strength of the transducer magnetic field at the three-axis magnetometer. The three-axis magnetometer has a sensed magnetic field range where it operates linearly, and the nulling magnetic field reduces the strength of the transducer magnetic field at the three-axis magnetometer such that the sensed magnetic field strength is in the sensed magnetic field range where the three-axis magnetometer operates linearly.

Embodiments may include one of the above and/or below features, or any combination thereof. The electro-acoustic transducer may comprise a magnetic structure that comprises the transducer magnet and magnetic material that guides the transducer magnetic field, wherein the magnetic structure may span a magnetic structure distance, and wherein the three-axis magnetometer may be located within a distance from the magnetic structure that is no greater than the magnetic structure distance. The transducer magnet may have a diameter of about 8 mm and the three-axis magnetometer may be positioned less than 10 mm from the electro-acoustic transducer. The transducer magnetic field strength at the position of the three-axis magnetometer may be at least 100 µT. The eyeglass headphone may further comprise a housing carried by the eyeglass temple piece. The transducer, the magnetic field sensor, and the nulling magnet may all be positioned in the housing.

DETAILED DESCRIPTION

In an audio device with an electro-acoustic transducer magnet and a magnetometer that is located close to the transducer, the transducer's magnetic field can overwhelm the magnetometer and prevent it from properly detecting the strength of the Earth's magnetic field. The magnetometer can be brought into a region of stable operation with an additional nulling magnet located such that its magnetic field partially or fully nulls the transducer magnetic field at the location of the magnetometer, sufficiently such that the magnetometer can operate in its linear operational region where stray magnetic fields do not overwhelm the Earth's magnetic field.

Figure 1:
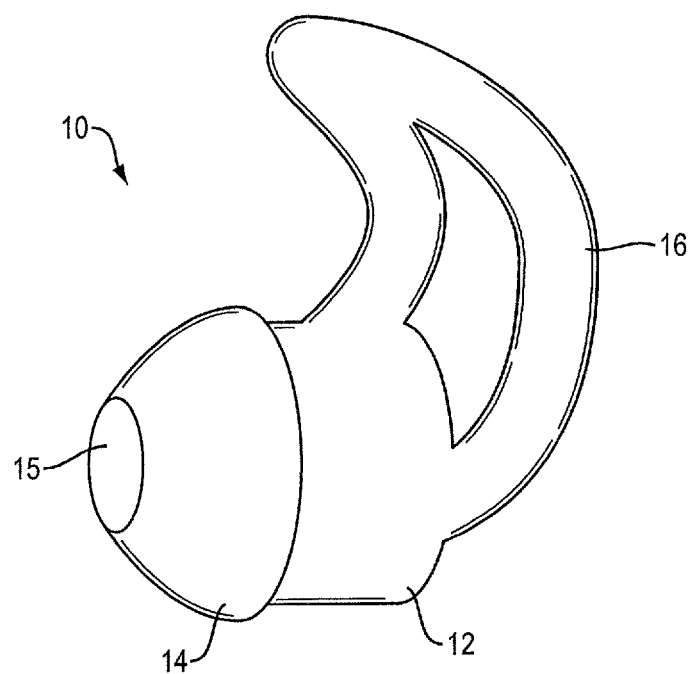
FIG. 1 is perspective view of an in-ear headphone.

FIG. 1 is a perspective view of in-ear headphone or earbud 10. An in-ear headphone is only one non-limiting example of the subject audio device. Other examples are described elsewhere herein. Earbud 10 includes body 12 that houses the active components of the earbud. Portion 14 is coupled to body 12 and is pliable so that it can be inserted into the ear canal. Sound is delivered through opening 15. Retaining loop 16 is constructed and arranged to be positioned in the outer ear, for example in the antihelix, to help retain the earbud in the ear. Earbuds are well known in the field (e.g., as disclosed in U.S. Pat. No. 9,854,345, the disclosure of which is incorporated herein by reference), and so certain details of the earbud are not further described herein. An earbud is an example of a headphone according to this disclosure, but is not limiting of the scope, as headphones can also be located on or over the ear, or even on the head near the ear.

Figure 2:
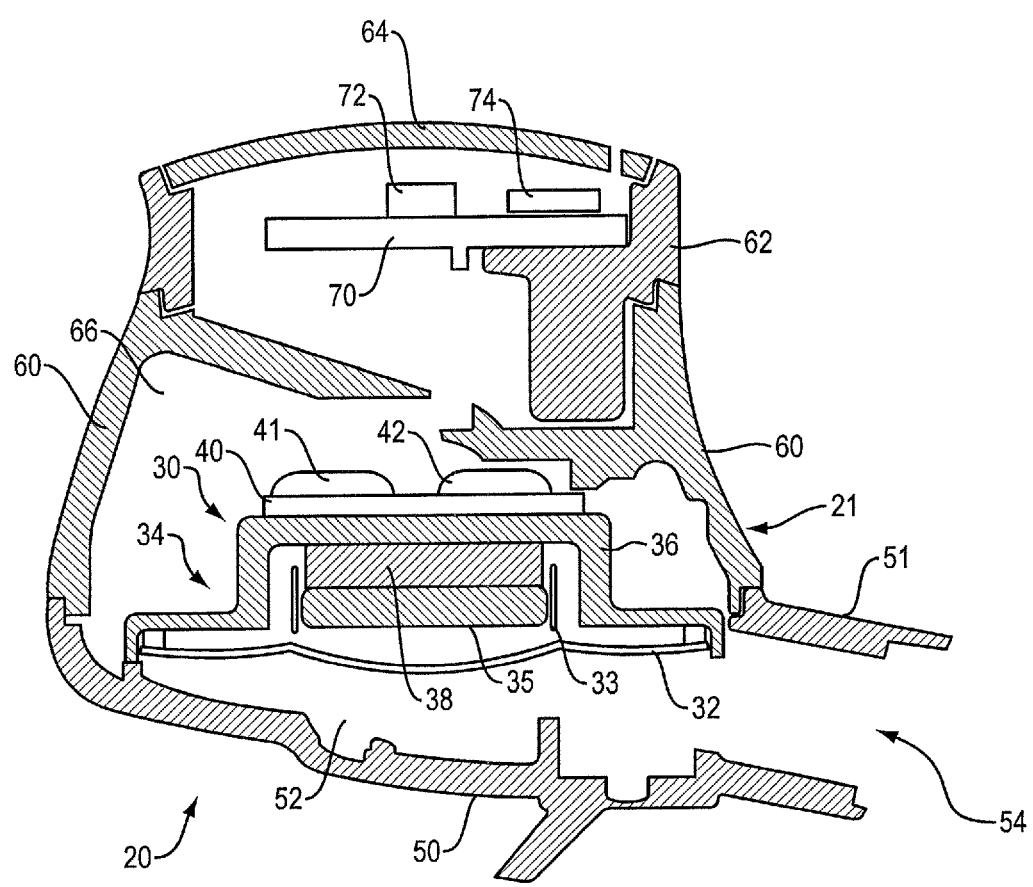
FIG. 2 is a partial cross-sectional view of elements of an in-ear headphone.

FIG. 2 is a partial cross-sectional view of only certain elements of an in-ear headphone 20 that are useful to a better understanding of the present disclosure. Headphone 20 comprises housing 21 that encloses electro-acoustic transducer 30. Housing 21 comprises front housing portion 50 and rear housing portions 60 and 62. Transducer 30 has diaphragm 32 that is driven in order to create sound pressure in front cavity 52. Sound pressure is directed out of front housing portion 50 via opening 54. When headphone 20 is an earbud, as shown by earbud 10 in FIG. 1, there is typically a pliable tip that is engaged with neck 51 of housing portion 50, to direct the sound into the ear canal.

In-ear headphone housing 21 further comprises a rear enclosure made from rear housing portions 60 and 62, and grille 64.

Transducer 30 further comprises magnetic structure 34. Magnetic structure 34 comprises transducer magnet 38 and magnetic material that functions to confine and guide the magnetic field from magnet 38, so that the field properly interacts with coil 33 to drive diaphragm 32, as is well known in the electro-acoustic transducer field. The magnetic material comprises cup 36 and front plate 35, both of which are preferably made from a material with relatively high magnetic susceptibility, also as is known in the field. Transducer printed circuit board (PCB) 40 carries electrical and electronic components that are involved in driving the transducer. Pads 41 and 42 are locations where wires (not shown) can be coupled to PCB 40.

Three-axis magnetometer 72 is mounted on PCB 70 and is arranged to sense the strength of magnetic fields in three axes at the location of the magnetometer, as is known in the field. Magnetometer 72 is configured to detect the Earth's magnetic field. The output of magnetometer 72 can be used to determine the direction in which the wearer's head is pointed, as described in U.S. Patent Application 62/626,967, filed on Feb. 6, 2018, the entire disclosure of which is incorporated herein by reference.

Since magnetometer 72 is close to transducer magnet 38, the transducer's magnetic field can overwhelm the magnetometer and prevent it from properly detecting the strength of the Earth's magnetic field. The magnetometer can be brought into its specified measurement range (where stray magnetic fields do not skew the desired measurement) with an additional nulling magnet 74. Nulling magnet 74 is located such that its magnetic field partially or fully nulls the transducer magnetic field at the location of magnetometer 72. This field nulling should take place in any one, two, or three of the three axes in which stable operation of the magnetometer is needed. In the present case, stable magnetometer results are desired in all three axes, so the nulling magnet is configured to sufficiently null the Earth's magnetic field in all three axes. It should be understood that the location of nulling magnet 74 in FIG. 2 is representative, and magnet 74 may actually be located elsewhere in housing 21. It should also be understood that magnet 74 could be a permanent magnet or an electromagnet, it being necessary only to properly place and orient a nulling magnetic field, as described elsewhere herein. The nulling should be sufficient such that magnetometer 72 can operate in its linear operational region where stray magnetic fields do not overwhelm the Earth's magnetic field. Linear operation of magnetometers (where there are stray magnetic fields that are not so strong that they overwhelm sensing or detection of the desired field) is known in the technical field, and so is not further described herein.

Figure 3:
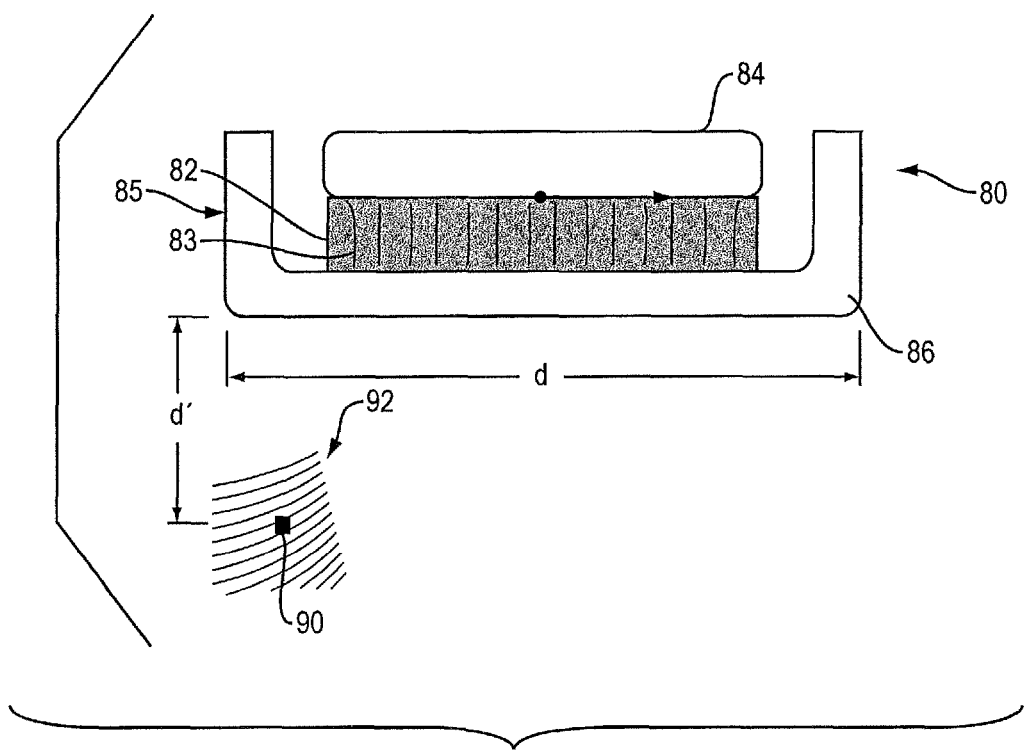
FIG. 3 is a schematic view of the magnetic structure of an in-ear headphone and its magnetic field at the location of a magnetic field sensor.
Figure 4:
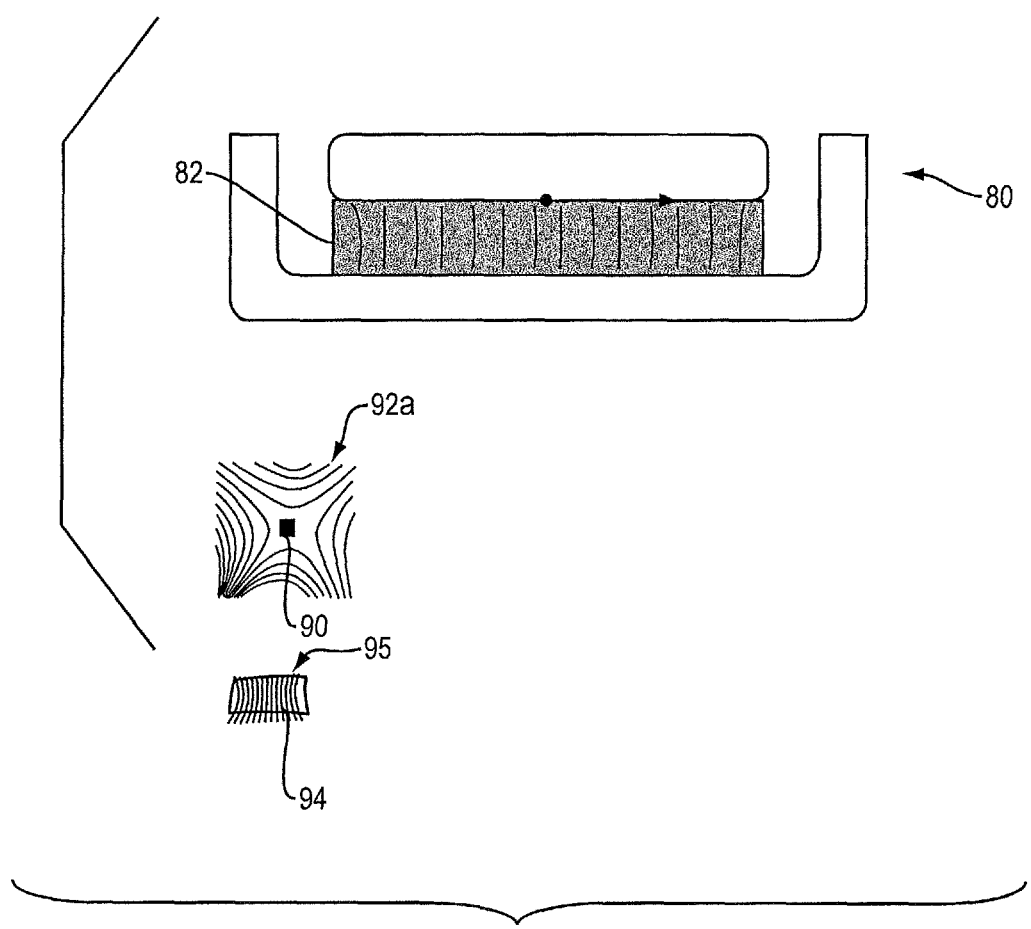
FIG. 4 is a view similar to that of FIG. 3 but including a nulling magnet.

FIGS. 3 and 4 illustrate aspects of an in-ear headphone. In-ear headphone electro-acoustic transducer 80 comprises magnet 82, and a magnetic structure 85 that comprises cup 86 and front member 84. Magnet 82 has a magnetic field, which is represented by the generally vertical field line representations 83. In one illustrative, non-limiting example, magnet 82 has a magnetic field strength of up to about 3000 µT. Magnetic fields and field line representations are well known in the art and so are not further described herein. The magnetic structure 85 spans a distance "d." Magnetometer 90 is spaced a distance "d'" from magnetic structure 85. The field from magnet 83 in the vicinity of magnetometer 90 is represented by field lines 92. In the example, the field strength of the magnetic field from magnet 82 in the vicinity of magnetometer 90 is about 500 µT; this is less than 3000 µT in part due to the distance of the magnetometer from the magnet, and in part due to the partial shielding of the magnetic field by magnetic structure 85. In contrast, the strength of the Earth's magnetic field is generally approximately 50 µT, or about $\frac{1}{10}^{th}$ of the field from magnet 82. With a stray field such as this that overwhelms the field to be sensed, magnetometer 90 will be inaccurate. Accordingly, the look direction sensing involving magnetometer 90 will be inaccurate. It should be understood that electro-acoustic magnet transducers can have varied shapes, sizes, locations, and field strengths, and that the illustrative values set forth in the examples are not limiting of the scope of this disclosure.

FIG. 4 illustrates schematically an effect of nulling magnet 94. Nulling magnet 94 has a magnetic field, which is represented by the generally vertical field line representations 95. Nulling magnet 94 has a size, shape, magnetic orientation, magnetic field strength, and location relative to transducer 80 and magnetometer 90 such that its magnetic field is superimposed on the field from the transducer magnet 82 sufficiently to fully or partially null the transducer field in three axes, at the location of magnetometer 90. In this non-limiting example, field nulling is indicated by field line representation 92*a*, showing a field null at magnetometer 90 (i.e., no field lines intersect magnetometer 90). It should be understood that the field does not need to be fully nulled by nulling magnet 94. Rather, as described above, the strength of the field needs to be reduced sufficiently such that the magnetometer can sense the Earth's magnetic field. The reduction in the transducer field at the magnetometer that needs to be accomplished with the nulling magnet will in part depend on the particular magnetometer used, as would be apparent to one skilled in the field. Also, it should be understood that magnetic fields are three-dimensional, while FIGS. 3 and 4 are two-dimensional. Those skilled in the field will understand the extent to which the transducer magnet's field in three dimensions needs to be nulled in order for the sensing of the Earth's magnetic field to be accomplished with sufficient accuracy for the particular application of the Earth's magnetic field sensor, and can make an appropriate selection of the nulling magnet parameters described above to accomplish such results.

In one non-limiting example, transducer magnet 82 can be a generally cylindrical magnet with a diameter of about 8 mm, and cup 86 can have a diameter d of about 10 mm. In one non-limiting example, sensor 90 can be positioned less than about 10 mm (distance d') from transducer 80. In one non-limiting example, the magnetic field strength of the transducer magnet at sensor 90 is at least about 100 µT.

Figure 5:
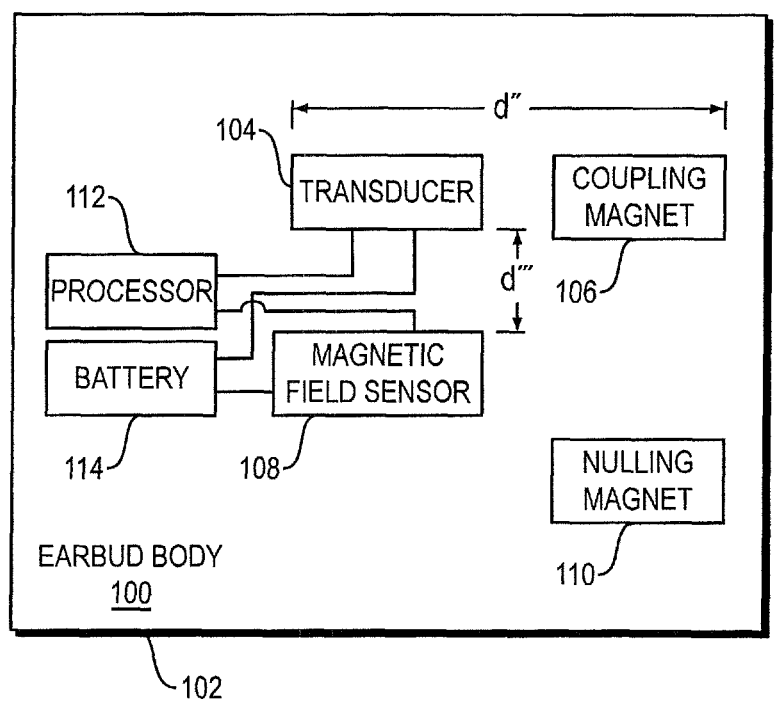
FIG. 5 is a schematic diagram of an in-ear headphone.

FIG. 5 is a schematic diagram of in-ear headphone 100, illustrating in part an exemplary placement of magnetic field sensor 108 relative to transducer 104 and an additional magnet 106. Battery 114 provides power to powered components. Processor 112 is used, in part, to drive transducer 104 and determine the wearer's look direction, in part using the output of magnetic field sensor 108. It should be understood that in-ear headphones will have more components and can have different components than those shown in FIG. 5. Some in-ear headphones include a magnet other than the transducer magnet. This other or additional magnet is represented in this non-limiting example by coupling magnet 106. Coupling magnet 106 can be used to couple headphone 100 to another structure. As one non-limiting example, magnet 106 can be used to dock or "park" an earbud to a neckband or a battery charger. Other uses of parking magnets are known in the field and are included within the scope of the present disclosure.

All of the magnets in earbud body 102 of headphone 100 create magnetic fields that can adversely impact the accuracy of the sensing of the Earth's magnetic field by sensor 108, as described above. In one example, the distance spanned by the earphone's magnetic structure 103 (comprising all of the magnets and magnetic material in the electro-acoustic transducer 104 together with the additional (coupling) magnet 106) is defined as d". D" can alternatively be defined as the inter-magnet distance. It is believed that when sensor 108 (which is located a distance d''' from magnetic structure 103) is within a distance equal to d" of magnetic structure 103, sensor 108 is in danger of being overwhelmed by the stray magnetic fields from magnetic structure 103. In other words, if d''' is less than or equal to d", there is a potential problem. Alternatively, a potential problem can be determined by measuring stray magnetic fields at the location of the magnetometer. If the stray fields are too large for the magnetometer to handle, nulling magnet 110 is used to sufficiently null the stray magnetic fields, as described above.

Elements of FIG. 5 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

The example of FIG. 5 comprises a processor that is configured to use computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

Off-ear headphones produce sound using an acoustic driver that is spaced from the ear. Such headphones should ideally deliver high-quality sound to the ears at desired volumes, without spilling too much sound to the environment. Eyeglass headphones can be accomplished with one or more dipole loudspeakers built into the eyeglass frame. Dipole loudspeakers produce out of phase sound from opposite sides of the loudspeaker's acoustic driver. The sound can be emitted from openings or vents in the eyeglass frame. If one vent is close to an ear and the other vent is farther from the ear, quality sound can be delivered to the ear with minimal spillage. An eyeglass headphone is disclosed in U.S. patent application Ser. No. 15/884,924, filed on Jan. 31, 2018, the entire disclosure of which is incorporated herein by reference.

Figure 6:
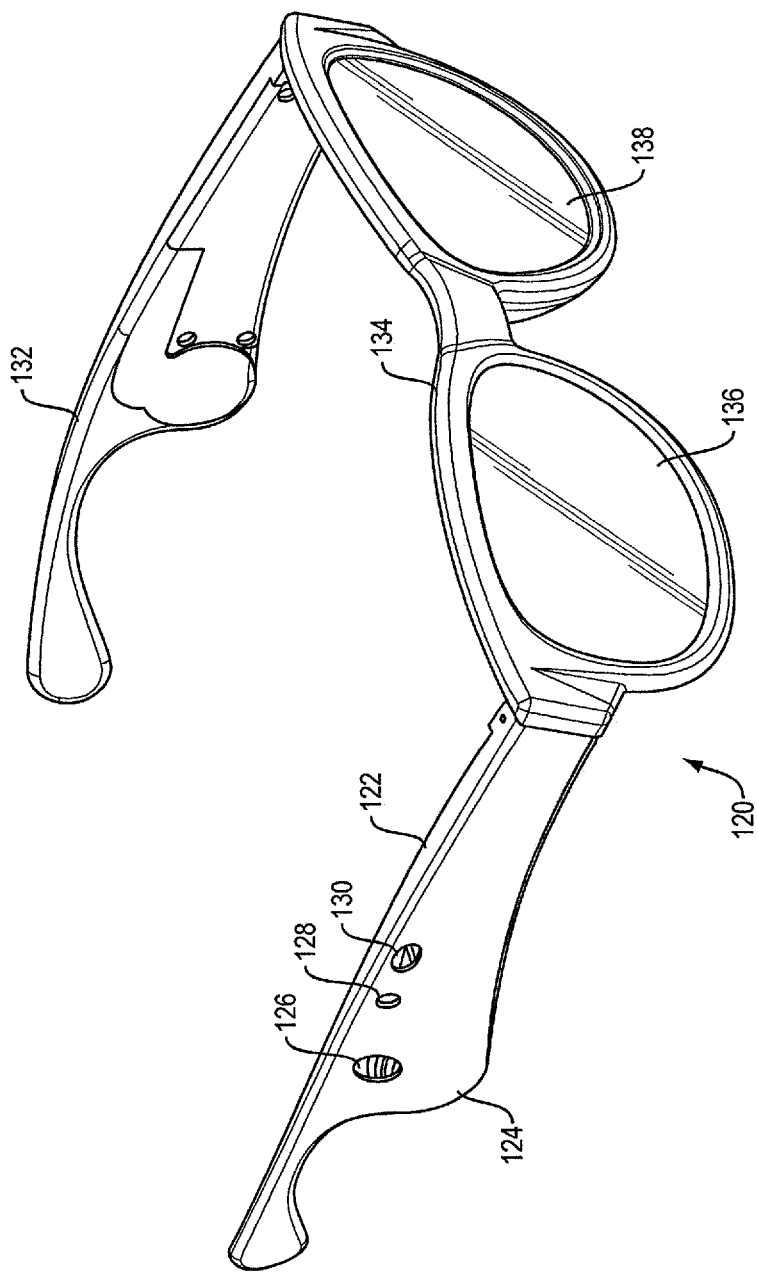
FIG. 6 is a front perspective view of eyeglass headphones.

FIG. 6 is a front, perspective view of eyeglass headphones 120, which are another non-limiting example of an audio device with a magnetic field sensor that could be overwhelmed by the stray fields from the magnet/magnetic material of the transducer without the nulling magnet that is configured to reduce the stray fields, as described above. In this non-limiting example there is an eyeglass bridge 134 that is constructed and arranged to sit on the nose, with lenses 136 and 138 in front of the eyes. Right temple piece 122 is coupled to bridge 134 and extends over the right ear. Left temple piece 132 is coupled to bridge 134 and extends over the left ear. Each temple piece carries a dipole loudspeaker. The right dipole loudspeaker is carried in section 124 of temple piece 122. Visible in this view are rear high-frequency dipole opening 126, rear low-frequency dipole opening 130, and rear resonance damping opening 128. Any or all of these three openings can be covered by a screen. The screen covering opening 128 is preferably resistive to accomplish waveguide resonance damping. Note that in this example the left temple piece 132 has a dipole transducer that is the same as that disclosed herein for the right temple piece.

Figure 7:
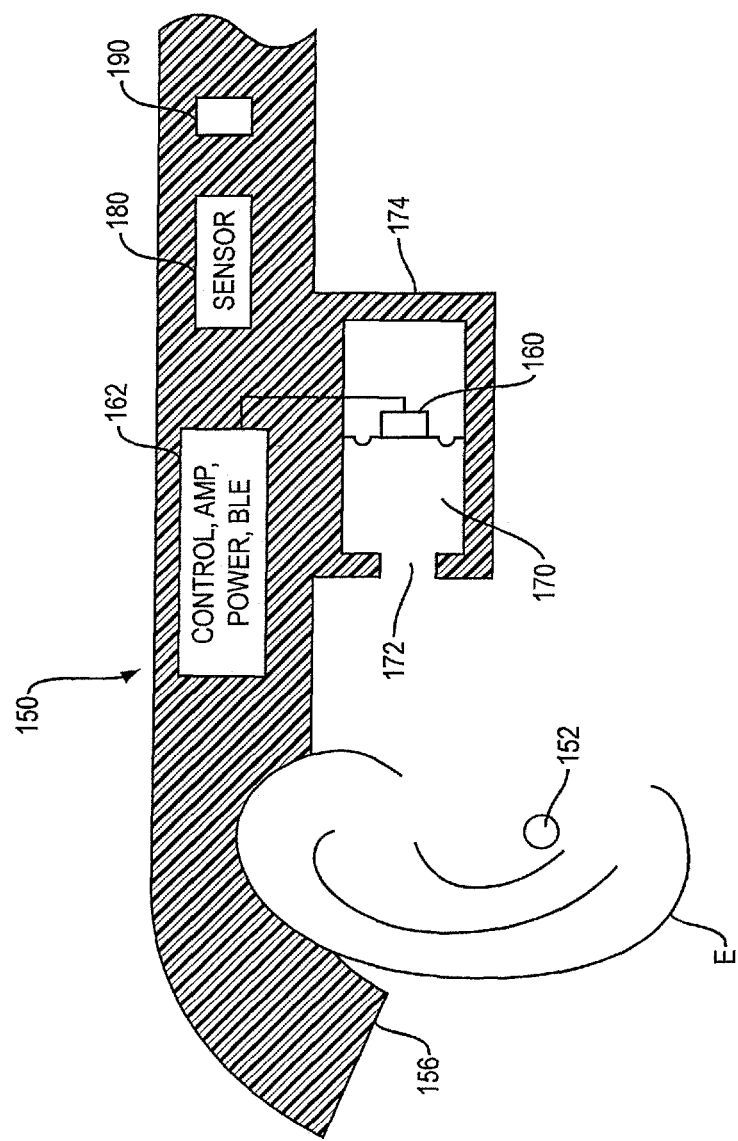
FIG. 7 is a partial cross-sectional schematic view of the right temple piece of eyeglass headphones.

FIG. 7 is a schematic cross-section of a temple piece 156 of eyeglass headphones 150. Eyeglass headphones 150 are another non-limiting example of an audio device with a magnetic field sensor that could be overwhelmed by the stray fields from the magnet/magnetic material of the transducer without the nulling magnet that is configured to reduce the stray fields, as described above. Electro-acoustic transducer 160 is located in housing 174 with front cavity 170. Transducer 160 has a transducer magnet (not shown in this view) that produces a magnetic field. Housing 174 is located such that an acoustic outlet 172 of housing 174 is arranged to direct sound toward ear E such that the sound can be received by ear canal 152 of the wearer's ear E. Magnetic field sensor 180 is carried by temple piece 156; sensor 180 may or may not be located in housing 174. Nulling magnet 190 is carried by temple piece 156, and may or may not be located in housing 174. Control, amplification, power and wireless communications module 162 is also carried by the eyeglass headphones 150, and may or may not be carried by temple piece 156.

A number of implementations have been described. Nevertheless, it will be understood that additional modifications may be made without departing from the scope of the inventive concepts described herein, and, accordingly, other embodiments are within the scope of the following claims.

What is claimed is:
1. An audio device, comprising:
   an electro-acoustic transducer for creating audio output, the electro-acoustic transducer comprising a transducer magnet that produces a transducer magnetic field having a magnetic field strength;

structure that is constructed and arranged to be positioned so as to direct the audio output towards an ear of a wearer;

a magnetic field sensor constructed and arranged to sense the Earth's magnetic field; and a nulling magnet constructed and arranged to produce a nulling magnetic field that reduces the strength of the transducer magnetic field at the magnetic field sensor;

wherein the magnetic field sensor has a sensed magnetic field range where it operates linearly, and wherein the nulling magnetic field reduces the strength of the transducer magnetic field at the magnetic field sensor such that the sensed magnetic field strength is in the sensed magnetic field range where the magnetic field sensor operates linearly.

2. The audio device of claim 1, wherein the magnetic field sensor comprises a three-axis magnetometer.

3. The audio device of claim 1, wherein the nulling magnet comprises a permanent magnet.

4. The audio device of claim 1, wherein the nulling magnet comprises an electromagnet.

5. The audio device of claim 1, wherein the electro-acoustic transducer comprises a magnetic structure that comprises the transducer magnet and magnetic material that guides the transducer magnetic field.

6. The audio device of claim 5, wherein the magnetic structure spans a magnetic structure distance, and wherein the magnetic field sensor is located within a distance from the magnetic structure that is no greater than the magnetic structure distance.

7. The audio device of claim 5, further comprising an additional magnet that is spaced from the magnetic structure by an inter-magnet distance.

8. The audio device of claim 7, wherein the magnetic field sensor is located within a distance from both the magnetic structure and the additional magnet that is no greater than the inter-magnet distance.

9. The audio device of claim 1, wherein the transducer magnetic field strength at the position of the magnetic field sensor is at least 100 µT.

10. The audio device of claim 1, wherein the magnetic field sensor is positioned less than 10 mm from the electro-acoustic transducer.

11. The audio device of claim 10, wherein the transducer magnet has a diameter of about 8 mm.

12. The audio device of claim 1, wherein the structure comprises an eyeglass temple, and wherein the transducer, the magnetic field sensor, and the nulling magnet are all carried by the eyeglass temple.

13. The audio device of claim 12, further comprising a housing carried by the eyeglass temple.

14. The audio device of claim 13, wherein the transducer, the magnetic field sensor, and the nulling magnet are all positioned in the housing.

15. An eyeglass headphone, comprising:

an electro-acoustic transducer for creating audio output, the electro-acoustic transducer comprising a transducer magnet that produces a transducer magnetic field having a magnetic field strength;

a temple piece constructed and arranged to be positioned proximate an ear of a wearer and to direct the audio output towards the ear;

a three-axis magnetometer carried by the temple piece and constructed and arranged to sense the Earth's magnetic field; and a nulling magnet carried by the temple piece and constructed and arranged to produce a nulling magnetic field that reduces the strength of the transducer magnetic field at the three-axis magnetometer;

wherein the three-axis magnetometer has a sensed magnetic field range where it operates linearly, and wherein the nulling magnetic field reduces the strength of the transducer magnetic field at the three-axis magnetometer such that the sensed magnetic field strength is in the sensed magnetic field range where the three-axis magnetometer operates linearly.

16. The eyeglass headphone of claim 15, wherein the electro-acoustic transducer comprises a magnetic structure that comprises the transducer magnet and magnetic material that guides the transducer magnetic field, wherein the magnetic structure spans a magnetic structure distance, and wherein the three-axis magnetometer is located within a distance from the magnetic structure that is no greater than the magnetic structure distance.

17. The eyeglass headphone of claim 16, transducer magnet has a diameter of about 8 mm and the three-axis magnetometer is positioned less than 10 mm from the electro-acoustic transducer.

18. The eyeglass headphone of claim 17, wherein the transducer magnetic field strength at the position of the three-axis magnetometer is at least 100 µT.

19. The eyeglass headphone of claim 15, further comprising a housing carried by the eyeglass temple piece, wherein the transducer, the magnetic field sensor, and the nulling magnet are all positioned in the housing.

* * * * *